US00RE38176E

(19) United States
(12) Reissued Patent
Wakamoto et al.

(10) Patent Number: US RE38,176 E
(45) Date of Reissued Patent: Jul. 8, 2003

(54) SCANNING EXPOSURE METHOD

(75) Inventors: Shinji Wakamoto, Tokyo (JP); Hidemi Kawai, Chiba (JP); Fuyuhiko Inoue, Kawasaki (JP)

(73) Assignee: Nikon Corporation, Tokyo (JP)

(21) Appl. No.: 09/286,001

(22) Filed: Mar. 31, 1999

Related U.S. Patent Documents

Reissue of:
(64) Patent No.: 5,617,182
Issued: Apr. 1, 1997
Appl. No.: 08/345,424
Filed: Nov. 21, 1994

(30) Foreign Application Priority Data

Nov. 22, 1993 (JP) ..... 5-291838
Aug. 26, 1994 (JP) ..... 6-201946

(51) Int. Cl.[7] ..... G03B 27/42; G03B 27/48; G03B 27/32

(52) U.S. Cl. ..... 355/53; 355/51; 355/77

(58) Field of Search ..... 355/53, 51, 77, 355/50, 95, 54, 67, 71; 356/399, 400, 401; 250/548

(56) References Cited

U.S. PATENT DOCUMENTS 4,488,806 A * 12/1984 Takahashi et al. ..... 355/77
4,747,678 A * 5/1988 Shafer et al. ..... 359/366
4,780,617 A * 10/1988 Umatate et al. ..... 250/548
4,833,621 A * 5/1989 Umatate ..... 364/491
4,924,257 A * 5/1990 Jain ..... 355/53
5,117,255 A * 5/1992 Shiraishi et al. ..... 355/53
5,194,893 A * 3/1993 Nishi ..... 355/53
5,227,839 A * 7/1993 Allen ..... 355/53
5,255,051 A * 10/1993 Allen ..... 355/77
5,281,996 A * 1/1994 Bruning et al. ..... 355/77
5,291,240 A * 3/1994 Jain ..... 355/53
5,305,054 A * 4/1994 Suzuki et al. ..... 355/53

FOREIGN PATENT DOCUMENTS

JP 06275495 * 9/1994 ..... H01L/21/27
JP 07335529 * 12/1995 ..... H01L/21/27

* cited by examiner

*Primary Examiner*—Rodney Fuller
(74) *Attorney, Agent, or Firm*—Miles & Stockbridge P.C.

(57) ABSTRACT

A step-and-scan exposure method *and a scanning exposure apparatus* in which a mask has a plurality of patterns and the number of patterns to be transferred to each shot area of a photosensitive substrate varies. The scanning and stepping movements are controlled in accordance with the number of patterns transferred, and dimensions of a pattern illumination area are varied in accordance with the patterns to be transferred. Transfer of a pattern to a shot area is omitted when an image of the pattern on the shot area would extend beyond the photosensitive substrate. Elimination of exposure scanning movements for patterns that are not to be transferred permits rapid movements of the mask and the substrate to scanning start positions.

32 Claims, 6 Drawing Sheets

SCANNING EXPOSURE METHOD

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a scanning-type exposure apparatus for scanning a mask (or a reticle) and a substrate synchronously to transfer a pattern of the mask to the substrate in a photolithography process for manufacturing, e.g., a semiconductor, a liquid crystal display device or a thin film magnetic head and more particularly to an exposure apparatus of a step-and-scan system for transferring a pattern of a mask to each of a plurality of shot areas on a substrate successively on a scanning exposure system.

2. Related Background Art

In a photolithography process for manufacturing a semiconductor or the like, a projection-type exposure apparatus is utilized in which the image of a pattern on a mask or a reticle (hereinafter referred to as the reticle) is transferred via a projection optical system to a photosensitive substrate (a wafer or glass plate with photoresist applied thereto). Recently, the sizes of semiconductors tend to be large and in projection-type exposure apparatuses, it is required to transfer a much larger pattern on a reticle to a photosensitive substrate.

Then, for example, scanning-type exposure apparatuses have been developed in which a reticle and a wafer are scanned synchronously with respect to a rectangular, circular arc or hexagonal illumination area (hereinafter referred to as the slit-like illumination area) to transfer a pattern larger than the slit-like illumination area to the wafer. Such apparatuses are disclosed in e.g. U.S. Pat. Nos. 4,747,678, 4,924,257, 5,194,893, 5,281,996, 5,227,839 and 5,255,051.

Particularly, in scanning and exposing a pattern on a reticle to each of a plurality of shot areas on a wafer, after an exposure for the first shot area has been completed, the stepping of the wafer is carried out so as to position the following shot area to a scanning start position. This system of repeating the stepping and the scanning exposure is called a step-and-scan system. The system of scanning the reticle and the wafer synchronously so as to transfer the pattern of the reticle to the wafer including the step-and-scan system is called "the scanning exposure system" hereinafter.

There are reticles in which each pattern area has a plurality of identical (or different) chip patterns. In this case, when carrying out scanning exposure by means of a stepper adopting a batch exposure processing system, the image of the whole patterns on such a reticle is projected even to each of shot areas located in the periphery of the wafer to which only a portion of the plurality of patterns can be projected (hereinafter referred to as the incomplete shot areas).

When transferring a plurality of chip patterns on a reticle to each of incomplete shot areas on a wafer on the scanning exposure system, the reticle and the wafer are scanned for length (the length of the full field) the same as when the whole chip patterns on the reticle are transferred to the wafer. Therefore, unnecessary portions of the incomplete shot areas (e.g., the peripheral end portion of the wafer) are exposed also. Therefore, time is wasted for scanning the unnecessary portions, which causes the exposure time per shot to become long. As a result, the throughput is lowered.

SUMMARY OF THE INVENTION

It is an object of the present invention to provided a scanning-type exposure apparatus in which when using a plurality of circuit patterns (chip patterns) arranged along a scanning direction or a non-scanning direction perpendicular to the scanning direction and exposing a plurality of shot areas on a photosensitive substrate on a step-and-scan system, the total time for moving the mask and/or performing the stepping of the substrate other than the time for exposing effective areas of the shot areas on the substrate is shortened to improve the throughput of the exposure process.

The present invention concerns on exposure method in which a mask stage for holding a mask and moving it in a first direction and a substrate stage for positioning a photosensitive substrate two-dimensionally and moving it in a direction corresponding to the first direction are used, and the pattern of the mask is transferred to each of a plurality of shot areas by positioning each of the shot areas to a scanning start position by a stepping operation of the substrate stage, and scanning the mask and the substrate synchronously by driving the mask stage and the substrate stage.

In the first method of the present invention, when exposing and scanning, with a mask having a plurality of circuit patterns arranged in a first direction, among a plurality of shot areas on a substrate, an incomplete shot area in the peripheral portion of the substrate to which one or several of the plurality of circuit patterns on the mask can be transferred, the mask and the incomplete shot area on the substrate are moved to respective scanning start positions by driving the mask stage and the substrate stage, and in synchronism with moving the mask by means of the mask stage along the first direction for a distance corresponding to the total width of the one or several of the plurality of circuit patterns to be transferred to the incomplete shot area, the substrate is moved by the substrate stage along a second direction for a distance corresponding to the total width of the image of the one or several of the plurality of circuit patterns to be transferred to the incomplete shot area. Also, after the scanning exposure, the mask stage is driven at a permissible highest speed to set the mask to the following scanning start position, and the substrate stage is driven to set a shot area on the substrate to be exposed next to a scanning start position.

It is preferable to provide, in an illumination optical system for emitting light to the mask, a variable field stop for varying the shape and/or the size of an illumination area on the mask. By changing the shape and/or the size of the illumination area by the use of the variable field stop during the scanning exposure, only the one or several of the plurality of circuit patterns to be transferred to the incomplete shot area is illuminated with light from the illumination optical system. That is, the circuit patterns other than the one or several circuit patterns are made not to enter the illumination area.

In the second method of the present invention, when scanning and exposing an incomplete shot area on a substrate with a mask having a plurality of identical circuit patterns along a second direction perpendicular to a first direction, the mask and the substrate are scanned synchronously by driving the mask stage and the substrate state after the incomplete shot area is overlapped with the image of the plurality of circuit patterns in the second direction for the total width of the image of the one or several of the plurality of circuit patterns on the mask, and the patterns other than the one or the several patterns are covered.

According to the first method of the present invention, for example, as shown in FIG. 2, the pattern area of a mask (R) is divided into, e.g., three sub-pattern areas (PA1 to PA3) along a first direction (scanning direction), and the same or different chip patterns are formed on the respective sub-pattern areas. As shown, for example, in FIG. 6, in a shot area (SA6) in the peripheral portion of a wafer (W), only one of the three chip patterns on the mask (R) can be transferred. Also, in an adjacent shot area (SA7) to be exposed next, only two chip patterns can be transferred. That is, those shot areas (SA6, SA7) are incomplete shot areas.

Only the chip pattern of one sub-pattern area (PA3) on the mask (R) is exposed to the incomplete shot area (SA6) on the substrate (W). Therefore, in FIG. 2, in synchronism with scanning the sub-pattern area (PA3) with respect to an illumination area (21), one-third of the shot area (SA6) on the substrate (W) is scanned with respect to an area corresponding to the illumination area (21) in a direction opposite to a locus (T6). Thereafter, the stepping of the substrate stage is performed at a permissible highest speed to set the shot area (SA7) on the substrate (W) to a scanning start position. In parallel to the stepping operation, the mask stage is driven at a permissible highest speed in a direction corresponding to a locus (U6) to set the second sub-pattern area (PA2) on the mask (R) to a scanning start position. Then, in synchronism with scanning only the sub-pattern areas (PA3, PA2) on the mask (R) with respect to the illumination area (21), two-thirds of the shot area (SA7) is scanned in a direction opposite to a locus (T7). Owing to such a sequence, the time for moving the mask and performing the stepping of the substrate other than the time for exposing the effective areas (here, the one-third, or two-thirds of the shot area) of the shot areas on the substrate (W) is shortened.

In the scanning exposure system, a predetermined approach run period (distance) is required until the mask (R) and the substrate (W) are scanned at respective constant speeds. In order to prevent the pattern of the mask (R) from being transferred to the substrate (W) during the approach run period, it is necessary to perform an operation for stopping the light emission of a light source for exposure, shielding light from the light source by means of a shutter, or closing the illumination area (21) by making the width of the illumination area (21) variable. In order to make the width of the illumination area (21) variable, it is preferable as shown in FIG. 1, to provide a variable field stop (6A, 6B, 7) in a plane conjugate to the pattern surface of the mask or in the vicinity of the plane. For example, when transferring only the chip patterns of two sub-pattern areas (PA1, PA2) of the mask (R) in FIG. 2 to the substrate (W), the sub-pattern area (PA3) is prevented from entering the illumination area (21) by means of the variable field stop, as shown in FIGS. 4A to 4C.

Also, in the case of making the width of the illumination area (21) variable by means of the variable field stop, for example, in FIG. 6, when the stepping of the substrate (W) is performed from the shot area (SA6) to which only the chip pattern of one sub-pattern area can be transferred to the shot area (SA7) to which the chip patterns of two sub-pattern areas can be transferred, the mask (R) is scanned for an amount corresponding to the amount indicated by the locus (U6) on the shot area (SA6) in the state with the illumination area closed. Then, in the following shot area (SA7), in synchronism with scanning the mask (R) in the direction opposite to the scanning direction of the mask in the shot areas (SA6) for an amount corresponding to the locus (T7) in the state with the illumination area (21) opened, the substrate (W) is scanned in the direction opposite to the locus (T7). Thereby, unnecessary movement of the mask is prevented, making it possible to shorten the exposure time.

In short, it is desirable to set an exposure sequence in accordance with the following rules in order to shorten the exposure time.

(1) In the complete shot areas on the substrate (W), exposure is not performed to a portion to which the pattern of one or two sub-pattern areas among the plurality of sub-pattern areas (PA1 to PA3) cannot be exposed completely.

(2) In the shot areas (SA1 to SA68) on the substrate (W), the patterns of the sub pattern areas (PA1 to PA3) are transferred to corresponding effective portions.

(3) When scanning and exposing the plurality of shot areas successively, the scanning directions of the shot areas are changed alternately oppositely. Thereby, the mask (R) repeats a simple reciprocating motion.

(4) After one shot area on the substrate (W) has been exposed, in parallel with performing the stepping of the substrate (W) by means of the substrate stage (14) to set the following shot area to a scanning start position, the mask (R) is moved to a scanning start position.

According to the second method of the present invention, for example, as shown in FIG. 9, a plurality of identical circuit patterns (PA4, PA5) are formed on a mask (R) along a second direction (non-scanning direction) perpendicular to a scanning direction and only one circuit pattern (PA5) on the mask (R) can be transferred to a shot area (SH1) on a substrate (W) in FIG. 10. Further, the width of the shot area (SH1) in the non-scanning direction is H and the width thereof in the scanning direction is V. When scanning and exposing the shot area (SH1), the shot area (SH1) is overlapped with the projected image (30A) of the plurality of circuit patterns on the mask in the non-scanning direction for the width H/2, and only the circuit pattern (PA5) on the mask (R) is scanned with an illumination area (21A), as shown in FIG. 9. Thereby, the circuit pattern is transferred to only the overlapped portion (effective portion) within the shot area (SH1). Next, when scanning and exposing a shot area (SH2) adjacent to the shot area (SH1) in the non-scanning direction, the stepping of the substrate (W) is performed for H/2. Therefore, the amount of stepping is half of the amount of stepping according to the conventional exposure method, whereby the throughput of the exposure process is improved.

DESCRIPTION OF THE PREFERRED EMBODIMENTS

Figure 1:
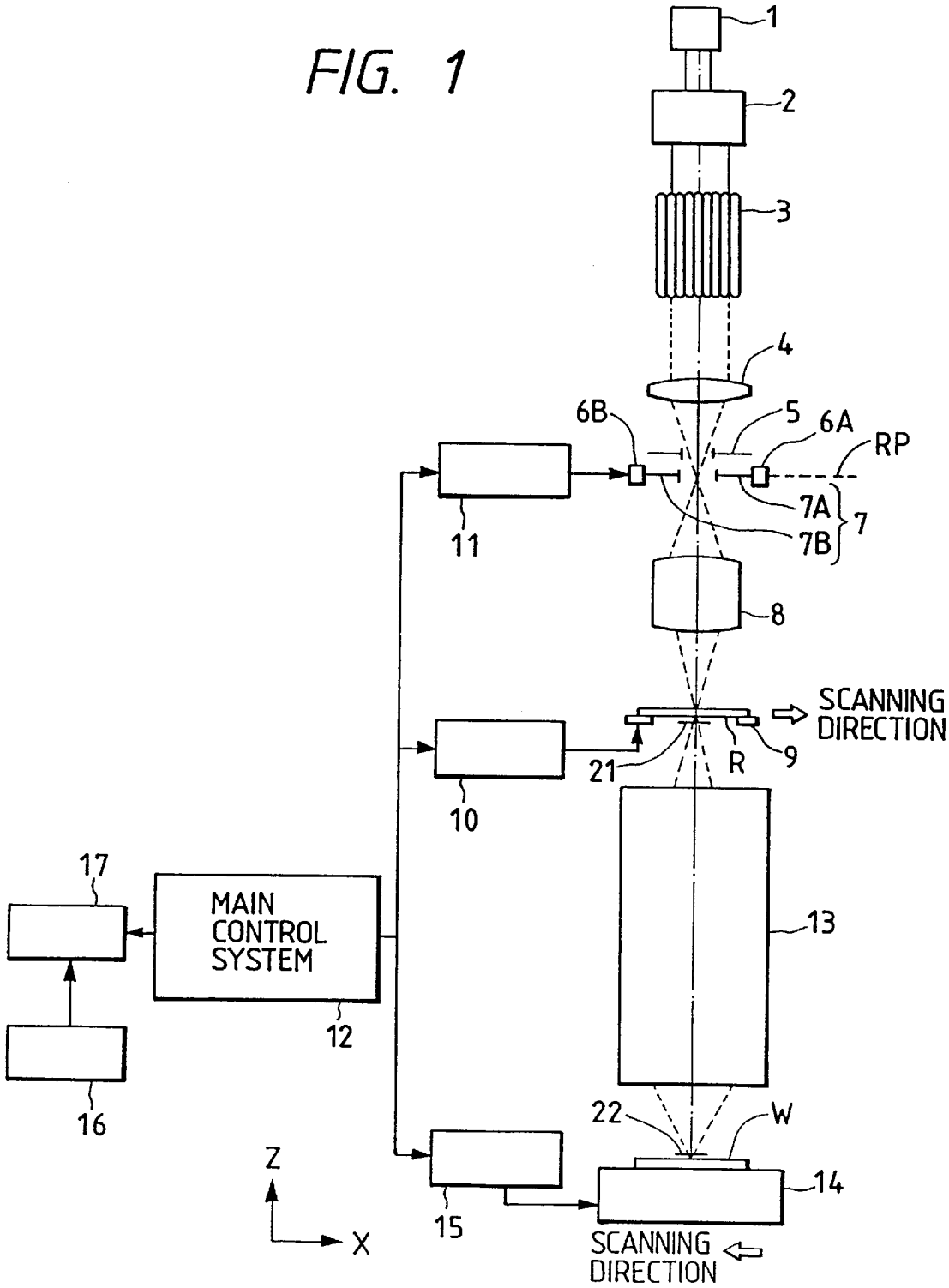
FIG. 1 schematically shows the structure of a projection exposure apparatus of a step-and-scan system according to embodiments of the present invention.

Hereinafter, embodiments of the present invention will be described with reference to the accompanying drawings. FIG. 1 schematically shows the structure of a projection exposure apparatus of a step-and-scan system used in each embodiment of the present invention.

In FIG. 1, light from a light source 1 illuminates a reticle R with uniform illuminance via an illumination optical system consisting of a shaping optical system 2, a fly eye lens 3, a condenser lens 4, a fixed field stop 5, drive sections 6A and 6B, a movable blind 7 and a relay lens system 8, and the image of a circuit pattern of the reticle R within a rectangular slit-like illumination area 21 is projected to a wafer W via a projection optical system 13. The light source 1 may be an excimer laser light source such as an ArF excimer laser or a KrF excimer laser, a metal vaporization laser light source, a pulsed light source such as a higher harmonic generator of a YAG laser, or a continuous light source formed of a mercury lamp and an elliptical mirror.

In the case of the pulsed light source, on or off of exposure is switched by the control of electric power supplied from a power supply device of the pulsed light source. On the other hand, in the case of the continuous light source, on or off of exposure is switched by a shutter in the shaping optical system 2. However, since the movable blind (variable field stop) 7 is provided in this embodiment, on or off of exposure may be switched by the opening and closing of the movable blind 7.

In FIG. 1, the diameter of the light flux from the light source 1 is set to a predetermined value by means of the shaping optical system 2. The light from the shaping optical system 2 reaches the fly eye lens 3. A plurality of secondary light sources are formed on the exit surface of the fly eye lens 3 and the light from the secondary light sources is condensed by the condenser lens 4 to reach the movable blind (variable field stop) 7 via the fixed field stop 5. Although the field stop 5 is disposed between the condenser lens 4 and the movable blind 7 in FIG. 1, it may be disposed between the movable blind 7 and the relay lens system 8.

A rectangular slit-like opening is formed in the field stop 5. The light passed through the field stop 5 becomes a light flux having a rectangular slit-like cross section and enters the relay lens system 8. The relay lens system 8 is a lens system for making the movable blind 7 and the pattern surface of the reticle R conjugate to each other. The field stop 5 is disposed in the vicinity of the movable blind 7. The movable blind 7 has a plurality of movable blades by which a rectangular opening is formed. In this embodiment, the movable blind 7 has two blades (light-shielding plates) 7A and 7B for defining the width of the rectangular opening in a scanning direction (X direction) and two blades (not shown) for defining the width of the rectangular opening in a non-scanning direction (Y direction) perpendicular to the scanning direction. The blades 7A and 7B for defining the width in the scanning direction are supported so as to be driven separately in the scanning direction by the respective drive sections 6A and 6B, and the blades for defining the width in the non-scanning direction are supported so as to be driven separately, also. In this embodiment, within the slit-like illumination area 21 on the reticle R set by the fixed field stop 5, only a desired area set by the movable blind 7 is illuminated with the light from the light source 1. That is, the moveable blind 7 varies the widths of the illumination area 21 in the respective scanning and non-scanning directions. The relay lens system 8 is a both-side telecentric optical system, and telecentric characteristics are maintained in the slit-like illumination area 21 on the reticle R.

The reticle R is disposed on a reticle stage 9 and the image of the circuit pattern within the slit-like illumination area 21 on the reticle R and the area limited by the movable blind 7 is projected to the wafer W via the projection optical system 13. An area (projection area of the circuit pattern) on the wafer W conjugate to the slit-like illumination area 21 is a slit-like exposure area 22. Also, within a two-dimensional plane perpendicular to the optical axis of the projection optical system 13, the scanning direction of the reticle R with respect to the slit-like illumination area 21 is a +X direction (or −X direction) and a direction parallel to the optical axis of the projection optical system 13 is determined as a Z direction.

The reticle stage 9 is driven by a drive section 10. At the time of the scanning exposure, the reticle R is scanned (constant movement) in the scanning direction (+X direction or −X direction). In parallel with this scanning operation, a control section 11 controls operations of the drive sections 6A and 6B of the movable blind 7 and the drive sections thereof for the non-scanning direction. The drive section 10 and the control section 11 are controlled by a main control system 12 for controlling the whole operations of the apparatus. On the other hand, the wafer W is disposed on a wafer stage 14 which is constituted of an XY stage for positioning the wafer W in a plane perpendicular to the optical axis of the projection optical system 13 and scanning (constant movement) the wafer W in the ±X direction and a Z stage for positioning the wafer W in the Z direction and the like. The main control system 12 controls positioning and scanning operations of the wafer stage 14 via a drive section 15.

Figure 2:
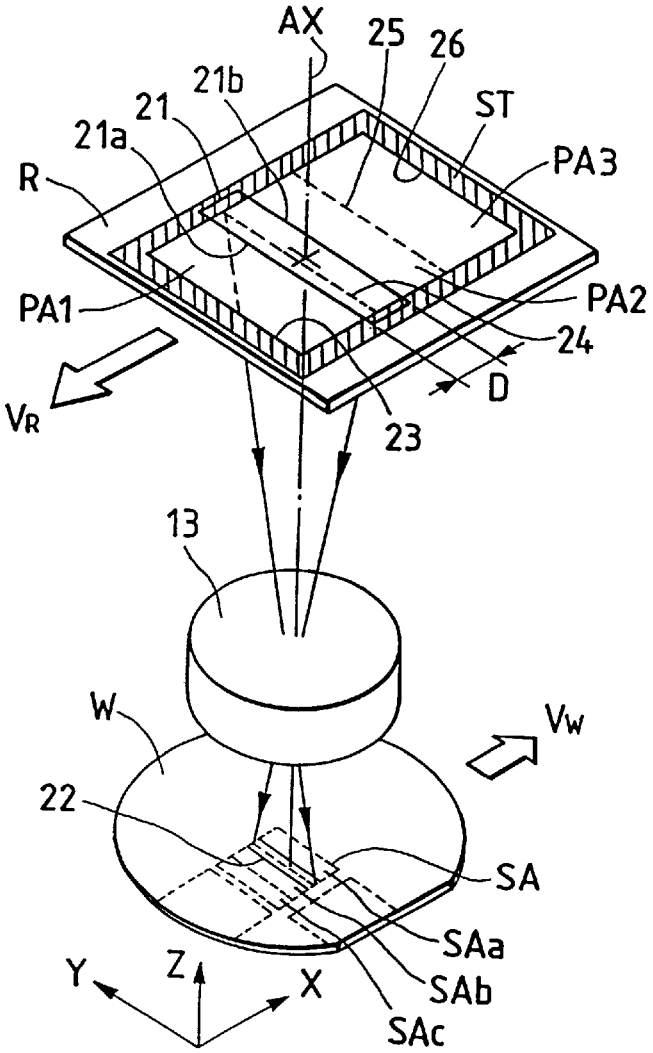
FIG. 2 is a perspective view for explaining the operation of a scanning exposure system.

As shown in FIG. 2, when transferring the image of the pattern on the reticle R to each shot area on the wafer W via the projection optical system 13 on the scanning exposure system, the reticle R is scanned at a speed VR in the −X direction (or +X direction) with respect to the slit-like illumination area 21 set by the field stop 5 in FIG. 1. Also, the magnification of the projection optical system 13 is set to β and in synchronism with the scanning of the reticle R, the wafer W is scanned at a speed VW (=β×VR) in the +X direction (or −X direction) with respect to the slit-like exposure area 22. Thereby, the image of the circuit pattern of the reticle R is transferred to the shot area SA on the wafer W.

Also, in this embodiment, edges 21a and 21b (see FIG. 2) of the illumination area 21 extending in the non-scanning direction (Y direction) can be moved separately in the scanning direction (X direction) by driving the blades 7A and 7B of the movable blind 7 in FIG. 1. Similarly, two edges of the illumination area 21 extending in the scanning direction can be moved separately in the non-scanning direction (Y direction). However, since the fixed field stop 5 is provided, even though the movable blind 7 is fully opened, the width of the illumination area 21 in the scanning direction is D and the width thereof in the non-scanning direction is L. The movable blind 7 is actuated when setting the width of the illumination area 21 in the scanning direction to be narrower than D and setting the width thereof in the non-scanning direction to be narrower than L. Ordinary, the width of the illumination area 21 in the scanning direction is set to D at the time of the scanning exposure and the movable blind 7 is actuated at the start and end of the scanning exposure.

In this embodiment, as shown in FIG. 2, the pattern area surrounded by a light-shielding zone ST on the reticle R is divided by boundary lines (broken lines) 24 and 25 into three sub-pattern areas PA1 and PA3 in the scanning direction parallel with the X-axis. The same circuit pattern is formed in these three sub-pattern areas.

Namely, the reticle R has the three circuit patterns. Correspondingly, the shot area SA on the wafer W is divided into three sub-shot areas SAa to SAc in the direction parallel to the X-axis and the sub-shot areas SAa to SAc have the same chip pattern formed in the previous exposure process. Generally, the respective circuit patterns of the sub-pattern areas PA1, PA2 and PA3 on the reticle R are transferred to the sub-shot areas SAa, SAb and SAc. In this case, the patterns of the reticle R are projected to the wafer W inversely by the projection optical system 13. Therefore, the direction of arrangement of the sub-pattern areas PA1 to PA3 is opposite to that of the sub-shot areas SAa to SAc.

However, since the patterns of the sub-pattern areas PA1 to PA3 are the same, for example, a sequence in which the pattern image of the sub-pattern area PA2 or the sub-pattern area PA3 on the reticle R is transferred to the sub-shot area SAa on the wafer may be adopted. Also, different patterns may be formed on the three sub-pattern areas PA1 to PA3 on the reticle R. In the case, different chip patterns are formed on the respective sub-shot areas SAa to SAc of the shot area SA on the wafer W and the sub-shot areas SAa to SAc correspond to the sub-pattern areas PA1 to PA3 with one to one.

The number of sub-pattern areas of the reticle R and the arrangement thereof are input via an input device 16 such as a keyboard in FIG. 1 into a memory 17 and the main control system 12 reads such pattern information regarding the reticle R from the memory 17 prior to determining an exposure sequence. Also, the arrangement (shot arrangement) of the shot areas on the wafer W can be obtained by detecting positions of several of alignment marks (not shown) provided on each shot area on the wafer W and performing statistic calculation for those several positions. This is called an enhanced-global-alignment system and disclosed in, e.g., U.S. Pat. Nos. 4,780,617 and 4,833,621.

Next, an exposure operation on the step-and-scan system in this embodiment will be described.

The conventional exposure method can be applied to shot areas whose entire surfaces are located on the wafer W like the shot area SA on the wafer W in FIG. 2, but in the peripheral portion of the wafer W, there are shot areas (hereinafter referred to as the incomplete shot areas) to each of which only the circuit pattern image of one sub-pattern area of the circuit pattern images of two sub-pattern areas among the three sub-pattern areas PA1 to PA3 can be transferred. In each incomplete shot area, the circuit pattern of one sub-pattern area or the circuit patterns of two-sub-pattern areas among the sub-pattern areas PA1 to PA3 on the reticle R are scanned and exposed.

First, the operation of the reticle R will be described with reference to FIGS. 3 to 5. In the embodiment, when scanning and exposing two shot areas on the wafer W continuously, an exposure sequence is set such that the reticle R performs a reciprocating motion. Thereby, unnecessary movement of the reticle can be avoided.

Figure 3:
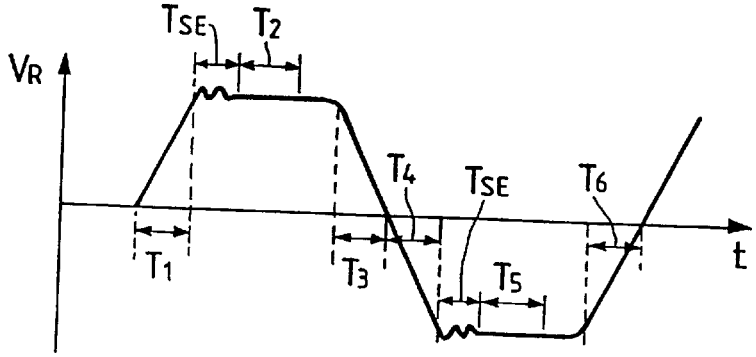
FIG. 3 is a graph showing the change in scanning speed of a reticle during scanning exposure.

FIG. 3 shows the change in scanning speed VR of the reticle R during its reciprocating motion. In FIG. 3, the reticle R starts to be accelerated in a period T1. Then, after a period TSE has elapsed, an exposure is performed in a period T2 in which the scanning speed VR of the reticle R is stable. Thereafter, the reticle R is decelerated in a period T3. A period T4 immediately after the reticle R is stopped is an acceleration period for the reticle R in the opposite direction. Then, after a period TSE, an exposure is performed in a period T5 in which the speed VR of the reticle R is stable. Thereafter, the reticle R is decelerated in a period T6 and this operation is repeated. In the latter half of each of the acceleration periods T1 and T4, the wafer W is also accelerated. From the latter half of the deceleration period T3 to the first half of the acceleration period T4 or from the latter half of the deceleration period T6 to the first half of the accelerated period T1, the following shot area on the wafer W is set to an acceleration start position (scanning start position) for a scanning exposure by a stepping operation of the wafer stage 14.

Next, the operation of the movable blind 7 in FIG. 1 when only the circuit patterns of two sub-pattern areas PA1 and PA2 on the reticle R are transferred on the wafer W by scanning the reticle R in, e.g., −X direction will be described with reference to FIGS. 4A, 4B, 4C and 5.

Figure 4A:
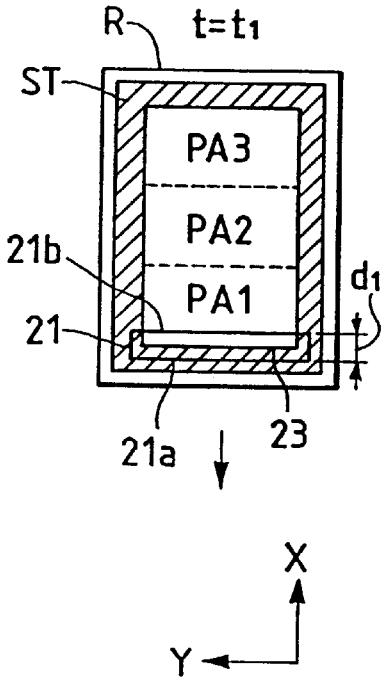
FIGS. 4A, 4B and 4C show an example of an operation of opening and closing an illumination area when transferring the patterns of two sub-pattern areas among a plurality of sub-pattern areas on the reticle to the wafer.
Figure 4B:
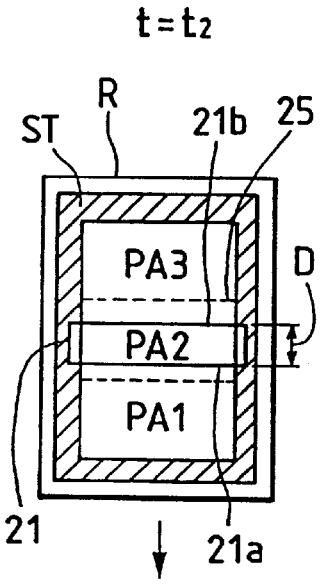
Figure 4C:
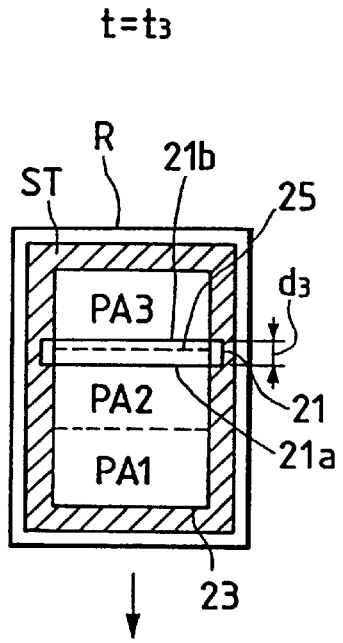
Figure 5:
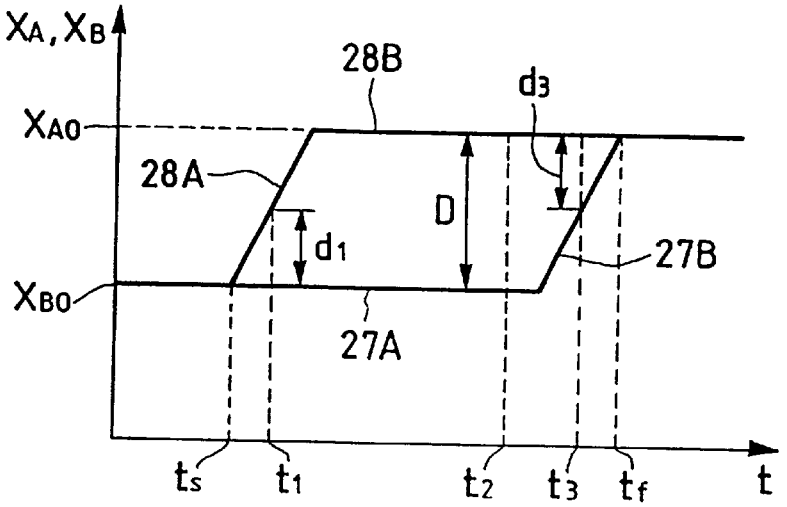
FIG. 5 shows movement of two edges of the illumination area in FIGS. 4A to 4C in a scanning direction.

FIGS. 4A to 4C show the change of the slit-like illumination area 21 during a scanning exposure. FIG. 5 shows moving positions of the edges 21a and 21b of the illumination area 21 in FIGS. 4A to 4C. In FIG. 5, the horizontal axis represents the elapsed time t, and the vertical axis is the X-axis XA of the edge 21a and the X-axis XB of the edge 21b. Lines 28A and 28B indicate the moving position of the edge 21a while lines 27A and 27B indicate the moving position of the edge 21b. These edges 21a and 21b are respective projected images of edges of the blades 7A and 7B of the movable blind 7 in FIG. 1 or projected images of edges of the field stop 5. In FIG. 5, the sign of the X-axis is minus and XAO<XBO holds.

In this case, by driving the blades 7A and 7B of the movable blind 7 in FIG. 1, the positions of the two edges of the illumination areas 21 are changed along the lines 27A, 27B and 28A, 28B and the illumination area 21 is changed like FIGS. 4A to 4C. That is, at a scanning start point is, both edges 21a and 21b are located at a position XBO and closed completely. Thereafter, the position of the edge 21a of the illumination area 21 is changed along the line 28A. At a point t1, as shown in FIG. 4A, the edge 21a is moved together with the light-shielding zone ST of the reticle R (precisely together with a boundary line 23 of the light-shielding zone ST of the reticle R). At this time, the edge 21b is kept stationary and the width of the illumination area 21 is widened to be d1.

Thereafter, when the width of the illumination area 21 becomes D, the edge 21a is stopped at a position XAO. For example, at a point t2, the edges 21a and 21b are kept stationary at the respective positions XAO and XBO, and as shown in FIG. 4B, the illumination area 21 is located on the sub-pattern area PA2 of the reticle R. The reticle R is further scanned and immediately after the boundary line 25 of the sub-pattern areas PA2 and PA3 has passed the edges 21b, the edge 21b is moved so as to follow the boundary line 25 in the −X direction as indicated by the line 27B in FIG. 5.

Then, at a point t3, the width of the illumination area 21 becomes d3 (<D) as shown in FIG. 4C. Thereafter, at a point tf when the scanning exposure of the sub-pattern area PA2 has been completed, the two edges 21a and 21b are closed completely.

Owing to the above operation, only the circuit patterns of two sub-pattern areas on the reticle R are transferred and an unnecessary pattern other than those will not be transferred. Similarly, when only the pattern of the sub-pattern area PA1, the pattern of the sub-pattern area PA3 or the patterns of the sub-pattern areas PA3 and PA2 of the reticle R are transferred to the wafer W, unnecessary patterns will not be exposed by operating the moveable blind 7 so as to change the width of the illumination area 21 in the scanning direction. Thereby, for example, during the approach run period before the scanning speed of the wafer W becomes constant or the period in which the stepping of the wafer W is performed to set the following shot area to the scanning start position, unnecessary patterns on the wafer W will mot be exposed.

Next, an exposure sequence for transferring the three circuit patterns formed on the reticle R of FIG. 2 in the scanning direction to each shot area on the wafer W will be described with reference to FIG. 6.

Figure 6:
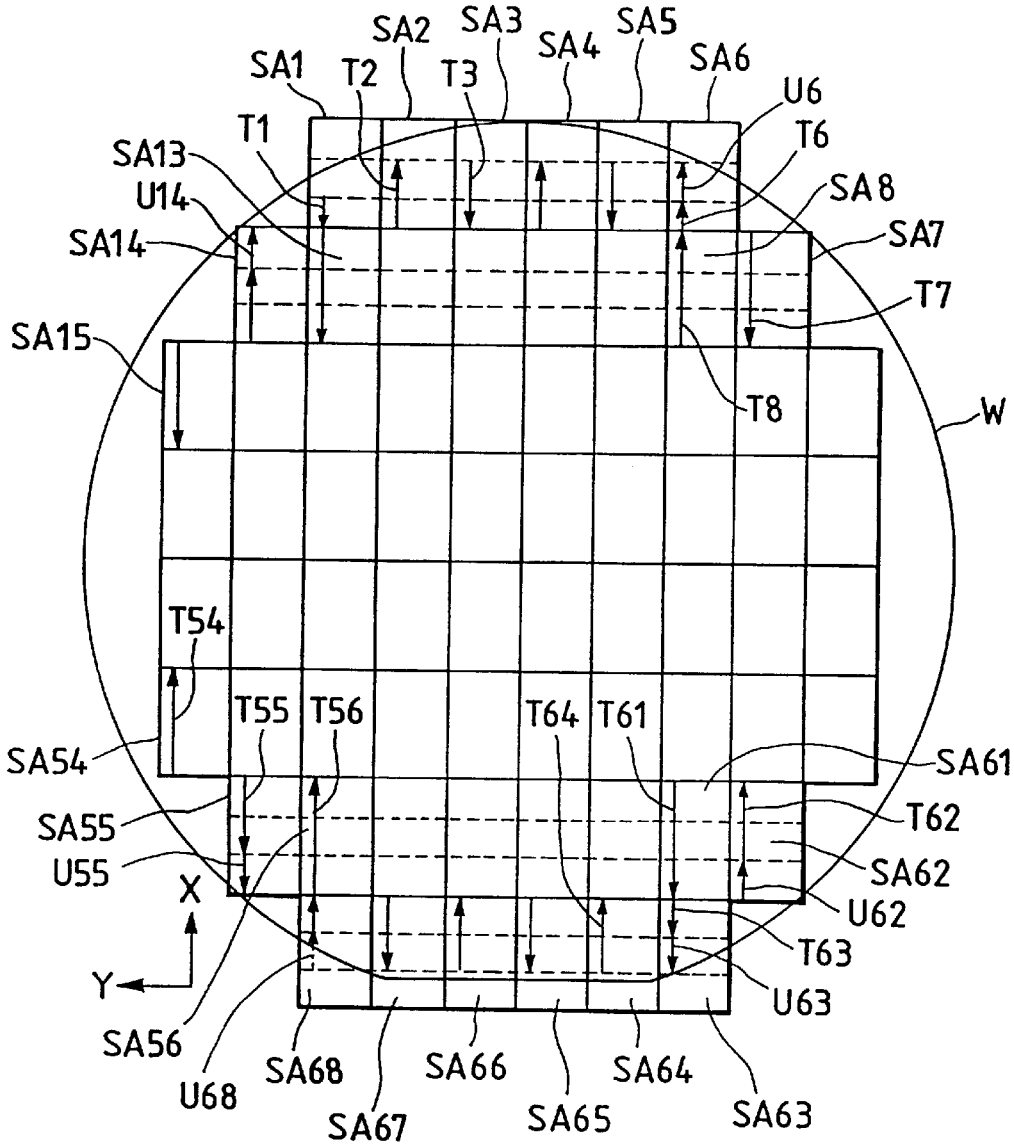
FIG. 6 shows the structure of the wafer to which an exposure sequence according to the first embodiment of the present invention is applied.

FIG. 6 shows the wafer W to be exposed in this embodiment. In FIG. 6, 68 shot areas SA1 to SA68 are arranged on the wafer W with predetermined pitch in the X direction (scanning direction) and the Y direction (non-scanning direction). Among the 68 shot areas, four shot areas SA1, SA6 SA63 and SA68 arranged in the peripheral portion of the wafer W are incomplete shot areas in which only the pattern image of the sub-pattern area PA3 or the sub-pattern area PA1 on the reticle R can be transferred, and the shot areas SA2 to SA5, SA7, SA14, SA55, SA62, and SA64 to SA67 are incomplete shot areas in which only the pattern images of the sub-pattern areas PA3 and PA2 or the sub-pattern areas PA1 and PA2 can be transferred. Among the sub-pattern areas PA1, PA2 and PA3, only the pattern image of one sub-pattern area or the pattern images of two sub-pattern areas are transferred to each of these incomplete shot areas.

According to the scanning exposure system, the upper left shot area SA1 on the wafer W is first exposed and then the shot areas SA2 to SA6 in the first line arranged in that order in the −Y direction are exposed successively. Next, the shot areas SA7 to SA14 in the second line arranged in that order in the +Y direction are exposed successively. Similarly, the shot areas in the following lines are exposed successively and the lower left shot area SA68 is exposed finally, whereby the exposure operation for the wafer W is completed. In FIG. 6, loci T1, T2, T3, . . . indicated by solid lines are loci of the slit like exposure area 22 with respect to the wafer W when scanning and exposing the shot areas SA1, SA2, SA3, . . . , and actually the wafer W is moved in directions opposite to the loci T1, T2, . . . . However, approach run periods for making the scanning speed constant are required in addition T1, T2, . . . actually. Also, the reticle R is scanned along loci conjugate to the loci T1, T2, . . . with respect to the projection optical system 13.

First, when scanning and exposing the first shot area SA1 on the wafer W, the third sub-shot area corresponding to one-third of the shot area SA1 is scanned with respect to the exposure area 22 in FIG. 6 in a direction opposite to the locus T1 in synchronism with the scanning of the sub-pattern area PA3 of the reticle R with respect to the illumination area 21 in FIG. 2. Thereafter, during the deceleration period for the reticle R, the stepping of the wafer stage 14 is performed and the lower edge of the second shot area SA2 is set to the scanning start position. Then, in synchronism with the scanning of the sub-pattern areas PA3 and PA2 of the reticle R with respect to the illumination area 21 in FIG. 2, the third and second sub-shot areas corresponding to two-thirds of the shot area SA2 are scanned with respect to the slit-like exposure area 22 in a direction opposite of the locus T2 in FIG. 6. Thereafter, the shot area SA3 to SA5 are scanned alternately in the opposite directions such that only two-thirds of the shot size (the length of each shot area in the scanning direction) is scanned, whereby the pattern images of two sub-pattern areas on the reticle are transferred to each of the shot area SA3 to SA5.

Next, in the last shot area SA6 of the first line, one-third of the shot area SA6 is scanned with respect the slit-like exposure area 22 in a direction opposite to the locus T6. At this time, on the side of the reticle R, the third sub-pattern area is scanned in a direction conjugate to the locus T6. However, in the following shot area SA7, the pattern images of two sub-pattern areas of the reticle R can be transferred to respective two sub-shot areas. Therefore, after the shot area SA6 has been exposed, the reticle stage 9 is driven at a permissible highest speed along a locus conjugate to the locus U6 to scan the reticle R in the state with the illumination area 21 of FIG. 2 closed. Then, the boundary line 24 of the sub-pattern areas PA1 and PA2 is set near to the outside of the edge 21a of the illumination area 21.

Figure 7:
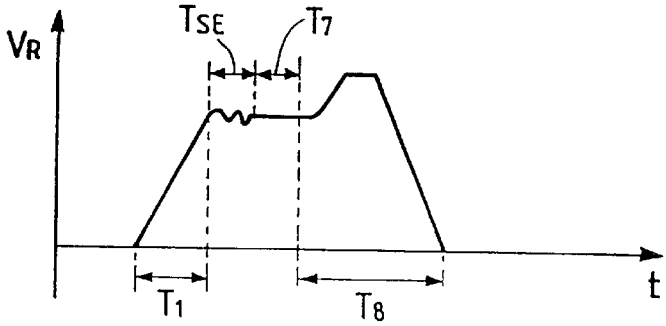
FIG. 7 is a graph showing an example of a change of scanning speed of the reticle when scanning and exposing each shot area on the wafer of FIG. 6.

FIG. 7 shows the change in scanning speed VR of the reticle R (reticle stage 9). In FIG. 7, first, in a period T1, the reticle R starts to be accelerated. After a period TSE has elapsed, one-third of the shot area SA6 is scanned and exposed in a period T7 in which the scanning speed VR is stable. Thereafter, in the first half of a period T8, the reticle stage 9 is driven at the highest speed to move the reticle R close to the following scanning start position and the reticle stage 9 is decelerated in the latter half of the period T8. Owing to this operation, the time for moving the reticle R other than the exposure time for transferring the pattern of the reticle R corresponding to the effective portion within the shot area on the wafer (e.g., one-third of the shot area SA6) is shortened, whereby the throughput of the exposure process is improved.

In this case, while the reticle R is moved in the direction corresponding to a locus U6 in FIG. 6, the stepping of the wafer stage 14 is performed at a permissible highest speed to set the first shot area SA7 of the second time line of the wafer W to a scanning start position. Thereafter, in synchronism with scanning the sub-pattern areas PA2 and PA3 of the reticle R with respect to the illumination area 21 in the −X direction in FIG. 2, two-thirds of the shot area SA7 is scanned with respect to the slit-like exposure area 22 in a direction opposite to the locus T7 in FIG. 6. Then, the shot areas SA8 to SA13 are scanned alternately in an opposite directions for a full field to transfer the pattern images of the whole sub-pattern areas of the reticle R to each of the shot areas SA8 to SA13. In the last shot area SA14 of the second line, after the two sub-shot areas have been exposed, the reticle R is moved in a direction corresponding to a locus U14 for a distance corresponding to a sub-shot area at a permissible highest speed. In parallel to this operation, the wafer stage 14 is driven at a permissible highest speed to set the first shot area SA15 of the third line to a scanning start position. Thereafter, the shot areas SA15 to SA54 are scanned and exposed in the same manner as conventional.

Thereafter, in the first shot area SA55 of the seventh line, in synchronism with scanning the reticle R in a direction conjugate to the locus T55, the wafer W is scanned in the opposite direction to the locus T55. Then, the illumination area 21 is closed, and the reticle R is moved at a permissible highest speed in the direction of a locus U55 while the wafer stage 14 is driven at a permissible highest speed to set the shot area SA56 to a scanning start position. Similarly, among the shot areas SA56 to SA68 in the seventh and eighth lines, in the incomplete shot areas SA62, SA63 and SA68, the reticle R is moved at a permissible highest speed along a locus U62, U63 or U68, and the wafer stage 14 is driven at a permissible highest speed to set the wafer W to a scanning part position. Also, in the shot area SA62, after the reticle R is driven at a highest speed in a direction corresponding to the locus U62, its speed is lowered and a scanning exposure is performed.

Figure 8:
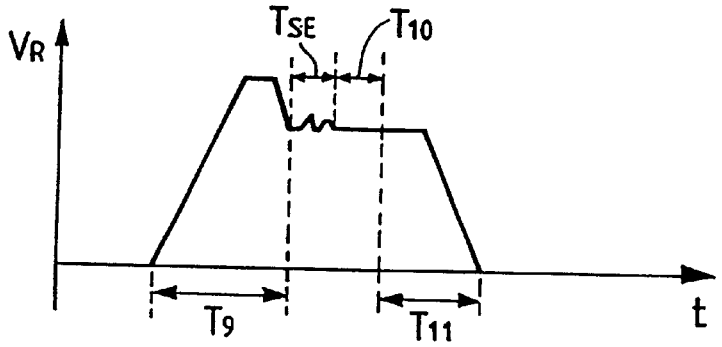
FIG. 8 is a graph showing another example of a change of scanning speed of the reticle when scanning and exposing each shot area on the wafer of FIG. 6.

FIG. 8 shows the change of scanning speed VR of the reticle R (reticle stage 9) at this time. In FIG. 8, first, in a period T9, the reticle R is driven at the highest speed in the direction corresponding to the locus U62 and thereafter decelerated. After a period TSE has elapsed, two-thirds of the shot area SA62 is scanned and exposed in a period T10 in which the scanning speed VR is stable. Thereafter, the reticle R is decelerated.

According to this embodiment, unnecessary patterns will not be transferred to the incomplete shot areas (e.g., the shot areas SA1 to SA7, SA14, etc.) and the exposure time is shortened, contributing to improvement of the throughput.

Also, in the above embodiment, as shown in FIG. 2, the sub-pattern areas PA1, PA2, PA3 on the reticle R correspond to the respective sub-shot areas SAa, SAb, SAc of each shot area SA with one to one. For example, the pattern image of the sub-pattern area PA1 is transferred to the sub-shot area SAa invariably. Further, as shown in FIG. 6, in the shot areas in a line (e.g., the shot areas SA1 to SA6) arranged in the non-scanning direction perpendicular to the scanning direction, the scanning directions of adjacent shot areas are opposite to each other. The idea of such a sequence is rational and the control according to the sequence is easy.

Next, another exposure sequence with respect to the wafer W of FIG. 6 will be described. As the same pattern is formed on the sub-pattern areas PA1 to PA3 of the reticle R shown in FIG. 2, for example, it is not always necessary to transfer the pattern image of the third sub-pattern area PA3 on the reticle R to, for example, the sub-shot area of the shot area SA1 on which the locus T1 is drawn in FIGS. 6. For example, after transferring the pattern image of the second sub-pattern area PA2 on the reticle R to each of the shot areas SA1 and SA6, the pattern images of the two sub-pattern areas PA1 and PA2 on the reticle R may be transferred to each of the shot areas SA2 to SA5 and SA7. However, in this case, when the stepping of the wafer W is performed from the shot area SA7 to the shot area SA8, it is necessary to move the boundary line 26 of the reticle R close to the outside of the illumination area 21.

Next, the propriety of a sequence in which the scanning directions of adjacent shot areas in the non-scanning direction are the same will be discussed. In this case, a sequence is considered in which the pattern image of the third sub-pattern area PA3 of the reticle R is transferred to the shot area SA1 in FIG. 6 and after the stepping of the wafer W is performed, the pattern images of the second and first sub-pattern areas PA2, PA1 are transferred to the shot areas SA2. Thereby, the shot areas SA1 and SA2 can be scanned in the same direction. However, the approach run period for the acceleration and deceleration is invariably required to scan the reticle R, so that it is necessary to reposition the reticle R in the scanning direction between the shot areas SA1 and SA2. Therefore, such a sequence is disadvantageous.

The above embodiment is effective for reticles in which a pattern area is divided into a plurality of sub-areas, as shown in FIG. 2. Also, since the fixed field stop 5 is provided other than the moveable blind 7 in the embodiment of FIG. 1, the width D of the slit-like illumination area 21 in the scanning direction can be set precisely. However, the field stop 5 may be omitted by improving the positioning accuracy of the movable blind 7, as disclosed in U.S. Ser. No. 068,101 (May 28, 1993).

Next, a second embodiment of the present invention will be described with reference to FIGS. 9 and 10. Although the present invention is applied to the projection exposure apparatus of the step-and-scan system of FIG. 1 in this embodiment also, this embodiment is different from the first embodiment in that a plurality of identical circuit patterns are arranged on a reticle along a non-scanning direction (Y direction).

Figure 9:
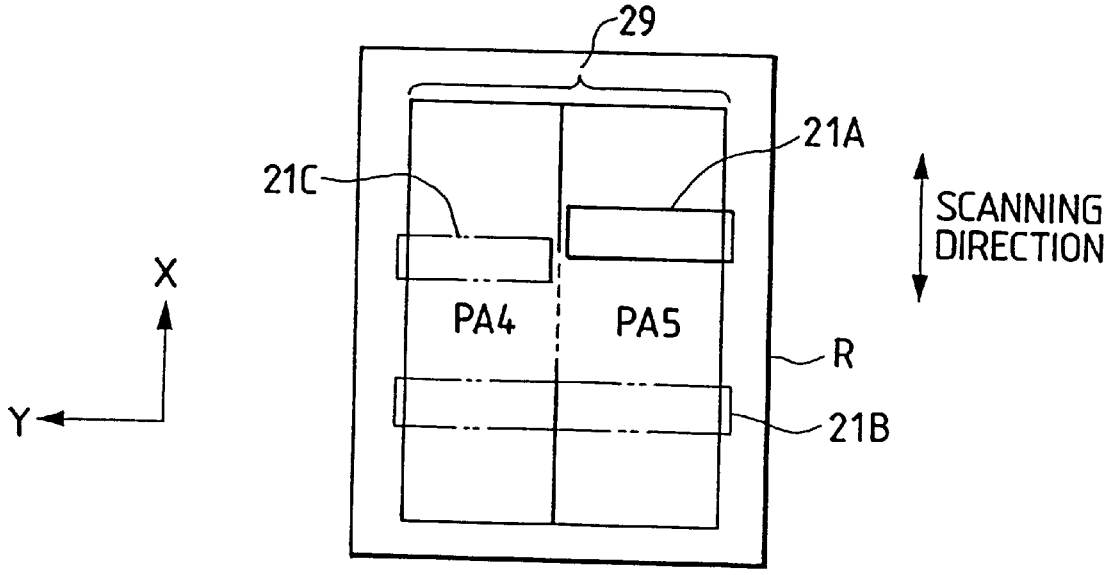
FIG. 9 shows the structure of a reticle used in the second embodiment of the present invention.

FIG. 9 shows the structure of a reticle R to be used in this embodiment. In FIG. 9, a pattern area 29 of the reticle R is divided into two sub-pattern areas PA4 and PA5 in the non-scanning direction (Y direction), and the same circuit pattern is formed on the sub-pattern areas PA4 and PA5. In the shot areas other than incomplete shot areas on the wafer W, the patterns of the two sub-patterns areas PA4 and PA5 are transferred for one scanning exposure.

Figure 10:
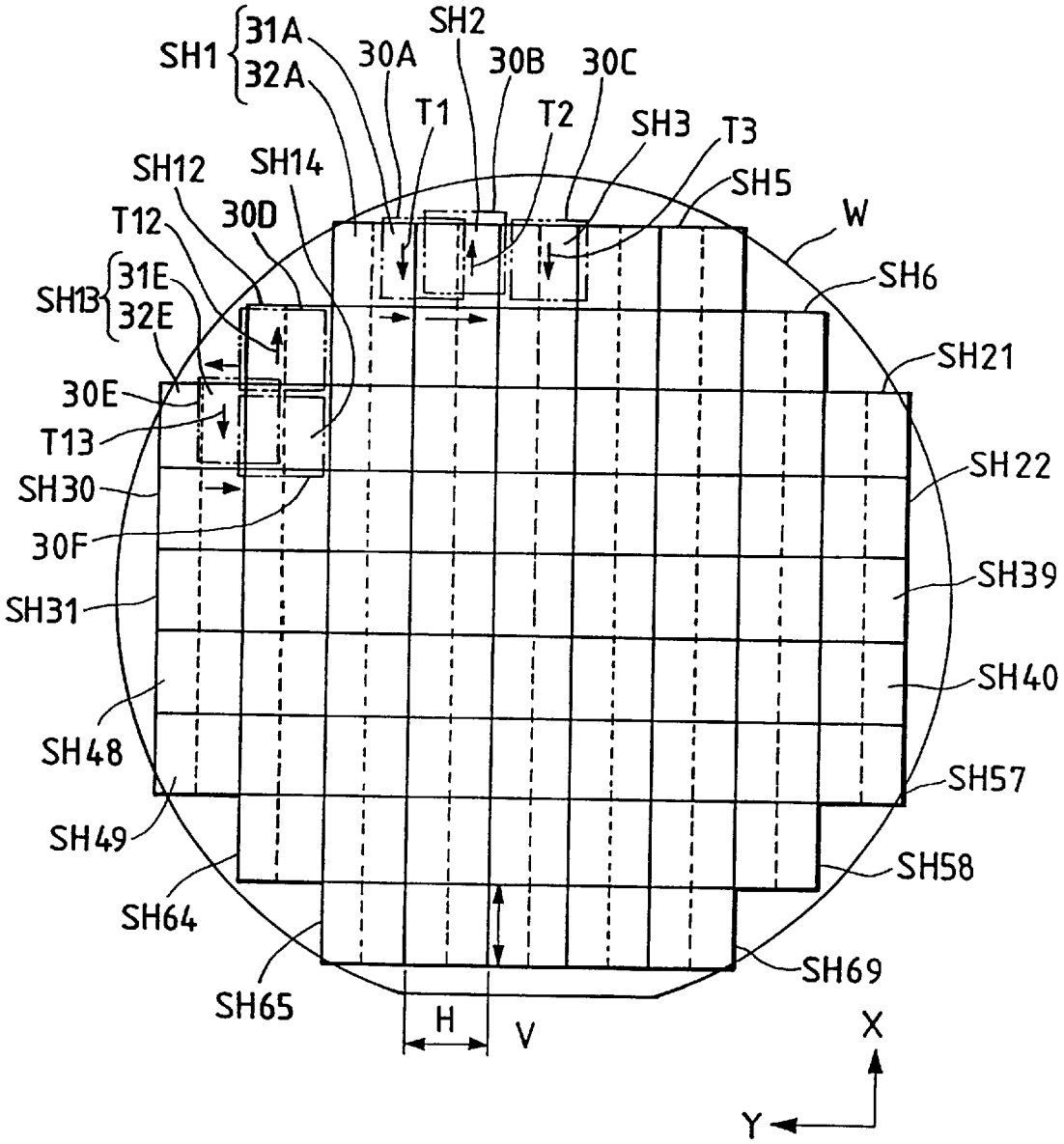
FIG. 10 shows the structure of a wafer to which an exposure sequence according to the second embodiment is applied.

FIG. 10 shows a wafer W to be exposed in this embodiment. In FIG. 10, 69 shot areas SH1 to SH69 are arranged on the wafer W with the pitch V in an X direction (scanning direction) and with the pitch H in the Y direction (non-scanning direction). Each of those shot areas is divided into two sub-shot areas in the Y direction. The pattern images of the sub-pattern areas PA4, PA5 of FIG. 9 are transferred to the respective sub-shot areas of each shot area according to the conventional method. However, eight shot areas SH1, SH5, SH13, SH21, SH49, SH57, SH65 and SH69 are incomplete shot areas in each of which the pattern image of one of the two sub-pattern areas PA4 and PA5 on the reticle R can be transferred. For example, although the shot area SH1 is divided into two sub-shot areas 31A and 32A in the Y direction, the sub-pattern area to which the whole pattern image of a sub-pattern area can be transferred is only the sub-shot area 31A. Similarly, although the shot area SH13 is divided into two sub-shot areas 31E, 32E, only the sub-shot area 31E is an effective portion to which the pattern image can be transferred.

In the scanning exposure system of this embodiment, for example, to be upper left shot area SH1 on the wafer W first starts the exposed, and then the shot areas SH2 to SH5 of the first line arranged in the −Y direction are scanned and exposed successively. Next, the shot areas SH6 to SH12 of the second line arranged in the +Y direction are scanned and exposed successively. Similarly, the other shot areas in the following lines are successively scanned and exposed in order of lines.

First, in the first shot area SH1 on the wafer W, the wafer W is positioned such that a projected image 30A of the two patterns on the reticle R is overlapped with the shot area SH1 in the non-scanning direction for the width of a sub-shot area 31A, i.e., H/2. In parallel with this positioning operation, as shown in FIG. 9, the position of the blades (not shown) of the movable blind 7 movable in the Y direction are adjusted such that only the sub-pattern area PA5 of the reticle R is illuminated by the illumination area 21A. Thereafter, in synchronism with scanning the reticle R with respect to the illumination area 21A in the −X direction, the wafer W of FIG. 10 is scanned with respect to an exposure area conjugate to the illumination area 21A in the +X direction. Thereby, the slit-like exposure area is moved along a locus T1 and the pattern image of the sub-pattern area PA5 is transferred to the sub-shot area 31A. Since the projection optical system 13 projects the inverted image, the pattern image of the sub-pattern area PA5 is transferred to the sub-shot area 31A.

Next, after the shot area SH1 has been scanned and exposed, the stepping of the wafer W is performed in the +Y direction for H/2 such that the shot area SH2 is superimposed precisely on a projecting image 30B of the reticle R in the Y direction. Then, as shown in FIG. 9, an illumination area 21B is set so as to cover the pattern area 29 on the reticle R in the Y direction, and the pattern images of the two sub-pattern areas PA4 and PA5 on the reticle R are transferred to the shot area SH2 on the scanning exposure system. Thereafter, for each of the shot areas SH3 to SH6, the scanning exposure is performed by carrying out the stepping of the wafer W in the +Y direction for the width H. Also, for each of the shot areas SH7 to SH12, the scanning exposure is performed by carrying out the stepping of the wafer W in the −Y direction for the width H.

Thereafter, when scanning and exposing the first shot SH13 of the third line after the shot area SH12 has been exposed, the stepping of the wafer W is carried out in the +Y direction (non-scanning direction) for H/2 and in the +X direction for V. Thereby, a right-hand sub-shot area 31E of the shot area SH13 is overlapped with the left half of a projected image 30E in the Y direction. In parallel with the stepping operation, as shown in FIG. 9, the moveable blind 7 is driven such that only the right-hand sub-pattern area PA5 of the reticle R is illuminated by the illumination area 21A. Then, the scanning exposure is started for the shot area SH13. Thereby, the slit-like exposure area is moved along a locus T13, and the pattern image of the sub-pattern area PA5 of FIG. 9 is transferred to the sub-shot area 31E. Next, when scanning and exposing the shot area SH14, the stepping of the wafer W is performed in the +Y direction for H/2, and the scanning exposure is performed such that a projected image 30F of the reticle R is superimposed precisely on the shot area SH14 in the Y direction. Similarly, the scanning exposure is performed for each incomplete shot area while reducing the amount of stepping.

In this embodiment as disclosed above, when moving, e.g., from the shot area SH1 to the shot area SH2 or from the shot area SH12 to the shot area SH13, the amount of stepping of the wafer W is only H/2 which is half of the amount of stepping according to the conventional system. Therefore, the time for moving the wafer W is shortened and the throughput of the exposure process is improved. Also, in FIG. 10, when scanning and exposing, e.g., the shot area SH5, the right half of the projected image of the reticle R may be overlapped with the left half of the shot area SH5. In this case, in FIG. 9, only the left-hand sub-shot area PA4 of the reticle R is illuminated by a illumination area 21C. However, in this case, when moving from the shot area SH5 to the shot area SH6, it is necessary to perform the stepping of the water W in the +Y direction for 3H/2, so that the amount of stepping is not reduced as a whole.

When a reticle R is divided into three or more sub-pattern areas in the non-scanning direction and the same pattern is formed on the sub-pattern areas, the present invention can be applied when setting an incomplete shot area to a scanning start position and when performing the stepping of the wafer W after the scanning exposure for the incomplete shot area, whereby the amount of stepping can be reduced.

Also, in the above embodiment, the shape of the illumination area 21, i.e., the opening of the field stop 5 is rectangular, but may be trapezoid, hexagonal, etc. Further, needless to say, the projection optical system may be a refractive system, a reflective system or a reflective and refractive system. Furthermore, the present invention is applicable not only to a projection exposure apparatus but also to a scanning type exposure apparatus of a proximity system.

The present invention is not limited to the above embodiments, and various modifications can be made without departing from the scope of the invention set forth in the accompanying claims.

What is claimed is:

1. A step-and-scan exposure method in which a photosensitive substrate and a mask having first and second patterns arranged sequentially in a mask scanning direction are scanned synchronously to expose an image of one or both of said patterns on each of a plurality of shot areas of said photosensitive substrate, comprising:

a step (a) in which, in synchronism with scanning of said mask in said mask scanning direction by an amount corresponding to a first dimension of said first pattern in said mask scanning direction, said photosensitive substrate is scanned by an amount corresponding to said first dimension, said first pattern being illuminated in the course of said mask scanning in step (a);

a step (b) in which, in synchronism with scanning of said mask in said mask scanning direction by an amount corresponding to a second dimension of both of said first and second patterns in said mask scanning direction, said photosensitive substrate is scanned by an amount corresponding to the second dimension, each of said patterns being illuminated in the course of said mask scanning in step (b); and wherein step (a) is preferred for some shot areas and step (b) is performed for other shot areas.

2. A step-and-scan exposure method according to claim 1, wherein step (a) is performed when an image of said second pattern on a shot area would extend beyond the photosensitive substrate.

3. A step-and-scan exposure method according to claim 1, wherein step (a) is performed after step (b).

4. A step-and-scan exposure method according to claim 1, further comprising a step (c) in which, after said photosensitive substrate is exposed to an image of said first pattern in step (a), said mask is moved in said mask scanning direction by an amount corresponding to a dimension of said second pattern in said mask scanning direction, without illuminating said second pattern.

5. A step-and-scan exposure method according to claim 4, wherein in step (c) said mask is moved at a maximum speed to a scanning start position.

6. A step-and-scan exposure method according to claim 4, wherein during step (c), said photosensitive substrate is moved at a maximum speed to a scanning start position for a next shot area.

7. A step-and-scan exposure method according to claim 1, wherein, when steps (b) and (a) are to be performed in that order for respective shot areas, step (b) is performed and then said mask is moved, without illuminating said mask, to a scanning start position and step (a) is performed.

8. A step-and-scan exposure method according to claim 7, wherein said mask is moved to said scanning start position at a maximum speed.

9. A step-and-scan exposure method in which a photosensitive substrate and a mask having first and second patterns arranged sequentially in a direction perpendicular to a mask scanning direction are scanned synchronously to illuminate one or both of said patterns and to expose an image of one or both of said patterns on each of a plurality of shot areas of said photosensitive substrate, comprising:

a step (a) in which, in synchronism with scanning of said mask in said mask scanning direction, while said first pattern is illuminated and said second pattern is not illuminated, said photosensitive substrate is scanned in a substrate scanning direction;

a step (b) in which said photosensitive substrate is moved in a direction perpendicular to said substrate scanning direction by a distance less than a dimension of an image of both of said first and second patterns in said direction perpendicular to said substrate scanning direction; and a step (c) in which, in synchronism with scanning of said mask in said mask scanning direction, while said first and second patterns are illuminated, said photosensitive substrate is scanned in said substrate scanning direction.

10. A step-and-scan exposure method according to claim 9, wherein step (a) is performed when an image of said second pattern would extend beyond a shot area of said photosensitive substrate.

11. A step-and-scan exposure method according to claim 9, wherein steps (c), (b), and (a) are performed in that order.

12. A step-and-scan exposure method in which patterns on a mask are transferred to shot areas on a photosensitive substrate by a series of scanning exposures, in each of which a mask, having a plurality of patterns arranged sequentially in a mask scanning direction, is moved in said mask scanning direction relative to a pattern illumination area, and a substrate is moved in a substrate scanning direction synchronously with the movement of the mask, wherein the number of said patterns to be transferred to different shot areas varies, and the extent of movements of said mask and said substrate for each scanning exposure is varied in accordance with the number of patterns to be transferred in each scanning exposure.

13. A step-and-scan exposure method according to claim 12, wherein a dimension of said illumination area in the mask scanning direction is varied so that when a pattern is not to be transferred to a shot area that pattern is not illuminated.

14. A step-and-scan exposure method according to claim 12, wherein a scanning start position of the mask relative to the pattern illumination area for each scanning exposure is controlled in accordance with the number of patterns to be transferred in that scanning exposure.

15. A step-and-scan exposure method according to claim 12, wherein after each scanning exposure, the mask and the substrate are moved to scanning start positions for a next scanning exposure, and wherein the movements of the mask and the substrate to the scanning start positions are performed at speeds substantially higher than the speeds at which the mask and the substrate are moved, respectively, during a scanning exposure.

16. A step-and-scan exposure method in which patterns on a mask are transferred to shot areas on a photosensitive substrate by a series of scanning exposures, in each of which a mask, having a plurality of patterns arranged sequentially in a direction transverse to a mask scanning direction, is moved in said mask scanning direction relative to a pattern illumination area, and a substrate is moved in a substrate scanning direction synchronously with the movement of the mask, and in which the number of said patterns to be transferred to different shot areas varies, comprising:

for each scanning exposure, overlapping a shot area with an image region containing images of one or more said patterns;

varying the amount of overlapping in accordance with the number of patterns to be transferred to each shot area; and controlling the size of the illuminating area during each scanning exposure so that only patterns to be transferred are illuminated.

17. A step-and-scan exposure method according to claim 16, wherein, after each scanning exposure, the substrate is stepped to overlap a next shot area with said image region, and wherein the extent of stepping is varied in accordance with the amount of overlapping in the scanning exposure of the preceding shot area.

*18. A step-and-scan exposure method in which each of a plurality of shot areas on a substrate is exposed through a mask having patterns, comprising:*

*a step (a) in which, in synchronism with movement of the mask along a direction in which the patterns are arranged relative to an energy beam, the substrate is moved by a first distance to expose a first shot area with the energy beam; and*

*a step (b) in which, in synchronism with movement of the mask along the direction relative to the energy beam, the substrate is moved by a second distance different from the first distance to expose a second shot area different from the first shot area with the energy beam.*

*19. A method according to claim 18, wherein said substrate is of a circular shape and one of said first and second shot areas is disposed close to the periphery of the substrate while the other of said first and second areas is disposed further from the periphery than said one of the shot areas.*

*20. A method according to claim 18, wherein at least one of said patterns is transferred onto said first shot area, and at least one of said patterns is transferred onto said second shot area, wherein the number of the patterns transferred onto said second shot area is different from the number of the patterns transferred onto said first shot area.*

*21. A step-and-scan exposure method in which each of a plurality of shot areas on a substrate is exposed through a mask, comprising:*

*a step (a) in which, in synchronism with movement of the mask relative to an energy beam, the substrate is moved by a first distance to expose a first shot area with the energy beam; and*

*a step (b) in which, in synchronism with movement of the mask relative to the energy beam, the substrate is moved by a second distance different from the first distance to expose a second shot area different from the first shot area with the energy beam.*

*22. A step-and-scan exposure method in which a pattern on a mask is transferred onto each of a plurality of shot areas on a substrate by a series of scanning exposures, the mask is moved relative to an energy beam and the substrate is moved in synchronism with the movement of the mask in each scanning exposure, wherein distances by which the substrate is moved in scanning exposures of different shot areas are varied in accordance with a shot layout on the substrate.*

*23. A step-and-scan exposure method in which each of a plurality of shot areas on a substrate is exposed with an energy beam, comprising:*

*a step (a) in which, the substrate is moved by a first distance, between scanning exposures of a first shot area and a second shot area adjacent to the first shot*

*area, in a non-scanning direction perpendicular to a scanning direction in which the substrate is moved in each scanning exposure; and*

*a step (b) in which, the substrate is moved by a second distance different from the first distance in the non-scanning direction between scanning exposure of the second shot area and a third shot area adjacent to the second shot area.*

*24. A method according to claim 23, wherein said substrate is moved in synchronism with movement of said mask in each scanning exposure, and said mask is moved in a direction perpendicular to a direction in which patterns on said mask are arranged.*

*25. A method for manufacturing devices including a process of transferring a device pattern onto a workpiece using the method according to claim 21.*

*26. A scanning exposure apparatus which exposes each of a plurality of shot areas on a substrate through a projection optical system, with an energy beam irradiated on a mask, comprising:*

*a mask stage disposed at an object side of said projection optical system;*

*a substrate stage disposed at an image side of said projection optical system;*

*a driving system connected to said mask stage and said substrate stage to move said substrate in synchronism with the movement of said mask upon scanning exposure of each of said shot areas; and*

*a controller connected to said driving system to control an operation of said scanning exposure in accordance with a shot layout on said substrate.*

*27. An apparatus according to claim 26, wherein said controller varies a distance by which said substrate is moved during the scanning exposure among the different shot areas.*

*28. An apparatus according to claim 26, wherein said controller functions such that the operation of the scanning exposure performed for a first shot area which is disposed close to the periphery of the substrate is different from the operation of the scanning exposure performed for a second shot area which is disposed further from the periphery than said first shot area.*

*29. A scanning exposure method comprising:*

*exposing each of a plurality of shot areas on a substrate with an energy beam irradiated on a mask by movement of the mask and the substrate relative to the energy beam for each shot area; and*

*changing a condition in a scanning exposure of the substrate with the energy beam in accordance with positions of the shot areas in the substrate, the condition being related to scanning distance of the substrate for the scanning exposure.*

*30. A method according to claim 29, wherein said condition is changed in scanning exposures of different shot areas of said plurality of shot areas.*

*31. A method according to claim 30, wherein said different shot areas includes at least one of shot area disposed close to the periphery of said substrate.*

*32. A method according to claim 29, further comprising:*

*moving said substrate, between scanning exposures of said plurality of shot areas with said energy beam, in a direction crossing a scanning direction in which said substrate is moved for each scanning exposure.*

* * * * *

UNITED STATES PATENT AND TRADEMARK OFFICE

CERTIFICATE OF CORRECTION

PATENT NO. : RE 38,176 E 
DATED : July 8, 2003
INVENTOR(S) : Shinji Wakamoto, Hidemi Kawai and Fuyuhiko Inoue It is certified that error appears in the above-identified patent and that said Letters Patent is hereby corrected as shown below:

Title page, Item [54] and Column 1, line 1,
Title should read -- SCANNING EXPOSURE METHOD AND APPARATUS --.

Signed and Sealed this

Ninth Day of December, 2003

JAMES E. ROGAN
*Director of the United States Patent and Trademark Office*